(12) United States Patent
Sun et al.

(10) Patent No.: US 12,538,754 B2
(45) Date of Patent: Jan. 27, 2026

(54) SEMICONDUCTOR SUBSTRATE HEATING DEVICE, SEMICONDUCTOR DEVICE AND TEMPERATURE CONTROL METHOD

(71) Applicant: SHENYANG KINGSEMI Co., Ltd., Shenyang (CN)

(72) Inventors: Yuanbin Sun, Shenyang (CN); Xinglong Chen, Shenyang (CN); Yunhe Jiang, Shenyang (CN); Yu Han, Shenyang (CN)

(73) Assignee: SHEYANG KINGSEMI Co., Ltd., Shenyang (CN)

( * ) Notice: Subject to any disclaimer, the term of this patent is extended or adjusted under 35 U.S.C. 154(b) by 707 days.

(21) Appl. No.: 17/919,046

(22) PCT Filed: Jun. 29, 2022

(86) PCT No.: PCT/CN2022/102414
§ 371 (c)(1),
(2) Date: Oct. 14, 2022

(87) PCT Pub. No.: WO2024/000285
PCT Pub. Date: Jan. 4, 2024

(65) Prior Publication Data
US 2024/0213080 A1    Jun. 27, 2024

(51) Int. Cl.
*H01L 21/687* (2006.01)
*H01L 21/67* (2006.01)
*H05B 3/26* (2006.01)

(52) U.S. Cl.
CPC .. *H01L 21/68785* (2013.01); *H01L 21/67248* (2013.01); *H05B 3/26* (2013.01); *H05B 2213/07* (2013.01)

(58) Field of Classification Search
CPC ............... H01L 21/67; H01L 21/67103; H01L 21/67248; H01L 21/683; H01L 21/68785; H05B 2213/07; H05B 3/26
(Continued)

(56) References Cited

U.S. PATENT DOCUMENTS

| | | | |
|---|---|---|---|
| 2001/0003901 A1* | 6/2001 | Bolandi | H01L 21/67109 62/3.3 |
| 2016/0370788 A1* | 12/2016 | Bailey, III | G05B 19/404 |
| 2023/0187251 A1* | 6/2023 | Choi | H01L 21/6833 219/444.1 |

* cited by examiner

*Primary Examiner* — Sang Y Paik
(74) *Attorney, Agent, or Firm* — Ziegler IP Law Group, LLC.

(57) ABSTRACT

The disclosure provides a semiconductor substrate heating device, comprising a heating cavity, a main heating part, a compensation control part and at least one temperature compensation unit. The compensation control part and several temperature compensation units are arranged in the heating cavity of the semiconductor substrate heating device, a top surface of the compensation control part and a bottom surface of a heating plate are arranged in a correspondence manner, and the several temperature compensation units arranged between the heating plate and the compensation control part and being in communication connection with the compensation control part are arranged in one-to-one correspondence with several temperature control compensation areas at the bottom surface of the heating plate. Complicated outgoing design is avoided, and temperature compensation adjustment can be performed on the temperature control compensation areas under the control of the compensation control part, thereby effectively controlling the temperature uniformity of the semiconductor substrate with as little manufacturing and maintenance costs as possible.

14 Claims, 3 Drawing Sheets

(58) Field of Classification Search
USPC .................................................... 219/444.1
See application file for complete search history.

SEMICONDUCTOR SUBSTRATE HEATING DEVICE, SEMICONDUCTOR DEVICE AND TEMPERATURE CONTROL METHOD

FIELD OF TECHNOLOGY

The disclosure relates to the technical field of semiconductor manufacturing, in particular to a semiconductor substrate heating device, a semiconductor device and a temperature control method.

BACKGROUND

Currently, substrate baking equipment is frequently used in a semiconductor substrate processing process. In a heating and baking process, the temperature uniformity of the substrate is of great importance in achieving the technological indexes of the substrate. In the prior art, for example, Chinese patent application publication No. CN103792974A adopts a technical solution of optimizing a heating circuit of a heater and properly increasing the number of zones of the heater to improve the temperature uniformity of a heating plate.

However, increasing the number of the zones of the heater will greatly prolong the development cycle and increase the development cost of the heater, greatly increase the cost of a temperature control part, at the same time occupy more space for installing hardware, and have more strict requirements on the management and control of the heater in the manufacturing process, resulting in reduction of the yield of the heater, and increased cost of the heater accordingly.

With the adoption of the solution of optimizing the heating circuit by increasing the number of the zones, more outgoing lines will be designed, which will make the wiring more complicated and increase the design difficulty of the peripheral structure of the heater.

Therefore, it is necessary to develop a novel semiconductor substrate heating device to solve the above problems in the prior art.

SUMMARY

The purpose of the disclosure is to provide a semiconductor substrate heating device, a semiconductor device including the semiconductor substrate heating device, and a temperature control method of the semiconductor device, which can effectively control the temperature uniformity of the semiconductor substrate with as little manufacturing and maintenance costs as possible.

To achieve the objective above, the semiconductor substrate heating device of the disclosure includes:
  a heating cavity;
  a main heating part comprising a heating plate arranged in the heating cavity, wherein a bottom surface of the heating plate comprises at least one temperature control compensation area;
  a compensation control part arranged in the heating cavity, wherein a top surface of the compensation control part is adjacent to the bottom surface of the heating plate;
  at least one temperature compensation unit arranged between the heating plate and the compensation control part and being in communication connection with the compensation control part;
  wherein, the temperature compensation unit and the temperature control compensation area are arranged in a correspondence manner, so as to perform temperature compensation adjustment on the temperature control compensation area under the control of the compensation control part.

The semiconductor substrate heating device provided by the disclosure has the beneficial effects that the compensation control part and several temperature compensation units are arranged in the heating cavity of the semiconductor substrate heating device, a top surface of the compensation control part is adjacent to a bottom surface of a heating plate, and the several temperature compensation units arranged between the heating plate and the compensation control part and being in communication connection with the compensation control part are arranged in one-to-one correspondence with several temperature control compensation areas arranged at the bottom surface of the heating plate. Complicated outgoing design is avoided, and temperature compensation adjustment can be performed on the temperature control compensation areas under the control of the compensation control part, thereby effectively controlling the temperature uniformity of the semiconductor substrate with as little manufacturing and maintenance costs as possible.

Preferably, the temperature compensation unit includes an auxiliary temperature adjustment part in communication connection with the compensation control part, and a distance between a top end of the auxiliary temperature adjustment part and the corresponding temperature control compensation area is greater than or equal to 0.

Further preferably, the auxiliary temperature adjustment part includes a heat conducting element or a refrigerating element.

Preferably, the temperature compensation unit further includes a fixing part connected with the auxiliary temperature adjustment part, and the auxiliary temperature adjustment part is fixed to the corresponding temperature control compensation area through the fixing part.

Preferably, the semiconductor substrate heating device further includes partition plates arranged between the main heating part and the compensation control part, and the temperature compensation unit is arranged at the partition plates.

Further preferably, component materials of the partition plate includes a heat insulation material.

Preferably, the number of the partition plates is at least 2, and the temperature compensation unit is clamped between the adjacent partition plates.

Preferably, the temperature compensation unit further includes a supporting part arranged at a bottom of the auxiliary temperature adjustment part and an elastic part arranged in the supporting part, the supporting part is arranged at the partition plate, and the elastic part, under the action of the supporting part, applies a force to the auxiliary temperature adjustment part in a direction toward the corresponding temperature control compensation area to adjust the top end of the auxiliary temperature adjustment part and the corresponding temperature control compensation area.

Further preferably, the supporting part includes an inner supporting part supporting the auxiliary temperature adjustment part and an outer supporting part surrounding the inner supporting part, and a spacing exists between outer side walls of the inner supporting part and of the outer supporting part.

Further preferably, one end of the elastic part is arranged in the outer supporting part, and the other end thereof is in contact with a bottom of the inner supporting part.

Further preferably, the elastic part surrounds the bottom of the inner supporting part and is in contact with the partition plate.

Further preferably, the inner supporting part is provided with a lead hole to allow a lead to pass therethrough.

Further preferably, the outer supporting part is provided with a lead hole to allow a lead to pass therethrough.

Further preferably, the main heating part further includes a main control part for temperature control, and the compensation control part is in communication connection with the main control part so as to perform the temperature compensation adjustment under the control of the main control part.

Further preferably, a top surface of the heating plate includes a substrate contact area, the bottom surface of the heating plate includes a bottom surface control area corresponding to the substrate contact area, and the temperature control compensation area is any area within the bottom surface control area.

The semiconductor device of the disclosure includes the semiconductor substrate heating device.

The semiconductor device further includes a temperature calibration part, the main heating part includes a main control part, the temperature calibration part is in contact with a heating surface of the heating plate in the semiconductor substrate heating device to acquire and feed back temperature calibration information, and the main control part is arranged outside the heating cavity and is in communication connection with at least one of the compensation control part and the temperature calibration part.

The temperature control method of the semiconductor device of the disclosure includes the following steps:

S0: providing the semiconductor device, wherein the semiconductor device includes a heating cavity, a main heating part, a compensation control part and at least one temperature compensation unit;

S1, driving, by the compensation control part, the at least one temperature compensation unit to perform temperature compensation adjustment on the heating plate of the main heating part.

DESCRIPTION OF THE EMBODIMENTS

In order to make objectives, technical solutions, and advantages of the disclosure clearer, the technical solutions in the disclosure are described clearly and completely in the following. Apparently, the described embodiments are only part rather than all of the embodiments of the disclosure. On the basis of the embodiments of the present disclosure, all other embodiments acquired by those of ordinary skill in the art without making inventive efforts fall within the scope of protection of the present disclosure. Unless otherwise mentioned, all technical and scientific terms used herein have the same meaning as commonly understood by one of ordinary skill in the art to which the invention belong. As used herein, "comprising", "including" and the similar words mean that elements or articles appearing before the word encompass the elements or articles or equivalents thereof listed after the word, but do not exclude other elements of articles.

An embodiment of the disclosure provides a semiconductor substrate heating device capable of improving uniformity of temperature control of a semiconductor substrate with as little manufacturing and maintenance costs as possible.

The semiconductor substrate heating device of the embodiment of the disclosure includes a heating cavity, a main heating part, a compensation control part and at least one temperature compensation unit.

In some embodiments, the main heating part includes a main control part, a heating plate and a main heating unit arranged at the heating plate, wherein the main control part is in communication connection with the main heating unit. The main control part is used for temperature control. The main control part performs temperature control on the main heating unit, a heating surface of the heating plate is allowed to generate heat by the main heating unit, the semiconductor substrate is placed toward the heating surface of the heating plate, and the heating surface of the heating plate transfers heat to the semiconductor substrate.

Specifically, the structural relationship among the main control part, the heating plate and the main heating unit and specific implementation are conventional technical means known to those skilled in the art, and thus are omitted here.

Figure 1:
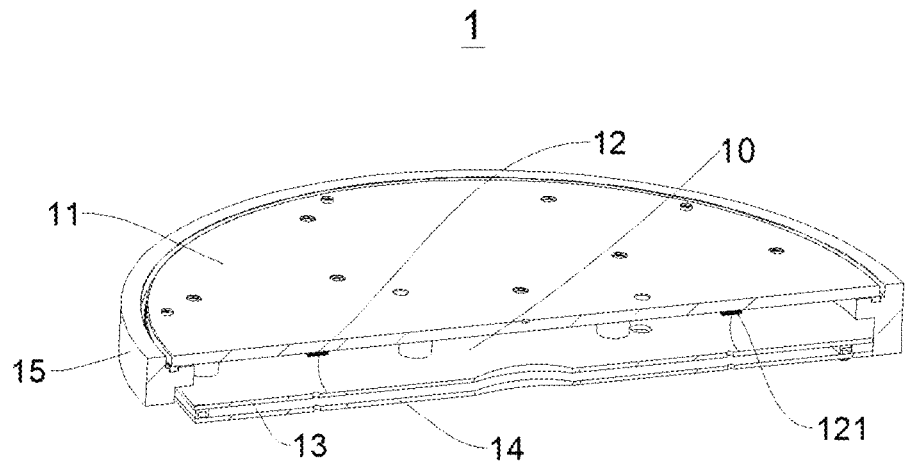
FIG. 1 is a partial structural diagram of a semiconductor substrate heating device according to an embodiment of the disclosure.

FIG. 1 is a partial structural diagram of a semiconductor substrate heating device according to an embodiment of the disclosure.

Referring to FIG. 1, in a semiconductor substrate heating device 1, a heating plate 11, at least one temperature compensation unit 12 and a compensation control part 13 are arranged in a heating cavity 10.

In some embodiments, a bottom surface of the heating plate 11 includes at least one temperature control compensation area.

In some embodiments, a top surface of the heating plate includes a substrate contact area, the bottom surface of the heating plate includes a bottom surface control area corresponding to the substrate contact area, and the temperature control compensation area is any area within the bottom surface control area.

The specific range of the temperature control compensation area and a distance between adjacent temperature control compensation areas are co-determined by the structural performance, technological requirements and installation conditions of the heating plate 11 itself.

In some specific embodiments, several temperature control compensation areas are distributed in an array manner relative to the center of the bottom surface control area. Specific array distribution types include, but are not limited to, a circular array and a rectangular array.

In some embodiments, referring to FIG. 1, a top surface of the compensation control part 13 is adjacent to the bottom surface of the heating plate 11, that is, a cavity area is enclosed between the top surface of the compensation control part 13 and the bottom surface of the heating plate 11. At least one temperature compensation unit 12 is arranged in an area between the heating plate 11 and the compensation control part 13, and is in communication connection with the compensation control part 13.

In some embodiments, the temperature compensation unit 12 is arranged corresponding to the temperature control compensation area, so as to perform temperature compensation adjustment on the temperature control compensation area under the control of the compensation control part 13.

In some embodiments, the compensation control part 13 is in communication connection with the main control part of the main heating part, so as to perform the temperature compensation adjustment under the control of the main control part.

In some embodiments, the main control part is arranged outside the heating cavity, and at least one temperature compensation unit 12 is arranged in an area between the heating plate 11 and the compensation control part 13, and is in communication connection with the compensation control part 13, such that a wiring in the heating cavity is concentrated between the heating plate 11 and the compensation control part 13, thus avoiding complicated wiring design and facilitating the disassembly and maintenance of the semiconductor substrate heating device.

Further, by electrically connecting the compensation control part 13 and the main control part through a single communication lead, the temperature compensation adjustment on the heating plate 11 can be realized through the control on the compensation control part 13, so that the complicated outgoing design is further avoided and the disassembly and maintenance of the semiconductor substrate heating device is facilitated.

In some specific embodiments, the compensation control part 13 is a circuit board, and a control circuit is arranged on a surface of the circuit board to control at least one temperature compensation unit 12. The specific implementation of control can be synchronous control or mutually independent control.

In some specific embodiments, the compensation control part 13 includes a control board composed of a Printed Circuit Board (PCB) and functional devices arranged at the PCB.

In some specific embodiments, the compensation control part 13 further includes a heat insulation structure that packages the control board, the heat insulation structure can cover at least one surface of the control board, such as a top surface of the control board facing the bottom surface of the heating plate 11, and does not affect electrical connection between the compensation control part 13 and the temperature compensation unit 12, so as to prevent a situation that function realization of the compensation control part 13 is affected by heat.

In some specific embodiments, the main control part is an upper computer.

In some embodiments, referring to FIG. 1, the temperature compensation unit 12 includes an auxiliary temperature adjustment part 121 in communication connection with the compensation control part 13.

In some embodiments, the auxiliary temperature adjustment part 121 includes a heat conducting element or a refrigerating element to exert a heating or refrigerating effect on the temperature control compensation area corresponding to the bottom surface of the heating plate 11.

In some embodiments, the auxiliary temperature adjustment part 121 interacts with the heating plate 11 in a contact manner, that is, a distance between a top end of the auxiliary temperature adjustment part 121 and the corresponding temperature control compensation area (not shown in the figure) is equal to 0, so that the top end of the auxiliary temperature adjustment part 121 is attached to the temperature control compensation area (not shown in the figure).

In some embodiments, the temperature compensation unit 12 further includes a fixing part connected to the auxiliary temperature adjustment part 121, and the auxiliary temperature adjustment part 121 is fixed to the corresponding temperature control compensation area through the fixing part.

In some specific embodiments, the heat conducting element of the auxiliary temperature adjustment part 121 is a ceramic heating sheet.

In some specific embodiments, the refrigerating element of the auxiliary temperature adjustment part 121 is a semiconductor refrigerating sheet.

In some specific embodiments, the fixing part is a high-temperature resistant adhesive.

In some embodiments, the auxiliary temperature adjustment part 121 is a small gas supply assembly.

In some embodiments, the small gas supply assembly is configured to spray clean refrigerant gas to the corresponding temperature control compensation area under the control of the compensation control part 13.

In some embodiments, the small gas supply assembly includes a gas circulation pipeline corresponding to each of the temperature control compensation areas, and the small gas supply assembly is configured to circulate clean refrigerant gas in the gas circulation pipeline through the gas circulation pipeline under the control of the compensation control part 13, so as to cool the corresponding temperature control compensation area.

In some embodiments, the auxiliary temperature adjustment part 121 is a small liquid supply assembly.

In some embodiments, the small liquid supply assembly includes a liquid circulation pipeline corresponding to each of the temperature control compensation areas, and the small liquid supply assembly is configured to circulate heating liquid in the liquid circulation pipeline under the control of the compensation control part 13, so as to heat up the corresponding temperature control compensation area.

Figure 2:
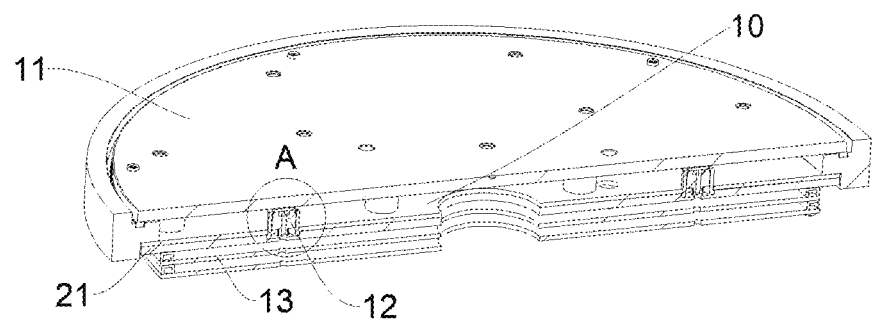
FIG. 2 is a partial structural diagram of another semiconductor substrate heating device according to an embodiment of the disclosure.
Figure 3:
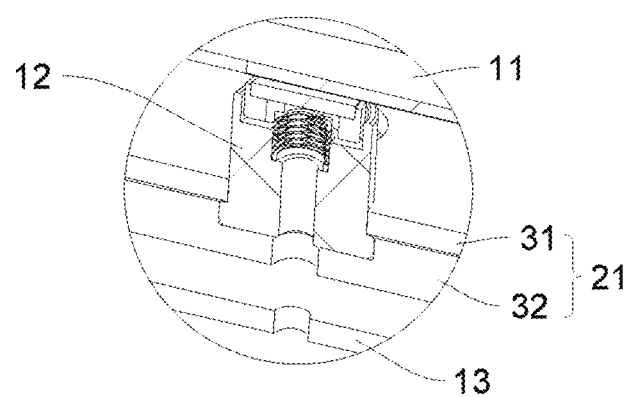
FIG. 3 is an enlarged structural diagram of a portion A shown in FIG. 2.

FIG. 2 is a partial structural diagram of another semiconductor substrate heating device according to an embodiment of the disclosure. FIG. 3 is an enlarged structural diagram of a portion A shown in FIG. 2.

In some embodiments, referring to FIG. 2 and FIG. 3, the temperature compensation unit 12 is suspended between the heating plate 11 and the compensation control part 13, so that the distance between the top end of the auxiliary temperature adjustment part 121 and the corresponding temperature control compensation area is greater than 0. The auxiliary temperature adjustment part 121 interacts with the heating plate 11 in a non-contact manner.

In some specific embodiments, a heating element of the auxiliary temperature adjustment part 121 is an LED lamp or a halogen lamp.

In some embodiments, the semiconductor substrate heating device further includes a partition plate arranged in the heating cavity 10. Referring to FIG. 2 and FIG. 3, a partition plate 21 is arranged between the heating plate 11 and the compensation control part 13, and the temperature compensation unit 12 is arranged on the partition plate 21.

In some embodiments, constituent materials of the partition plate 21 include a heat insulation material, which is beneficial to maintain a heat transfer effect of the heating plate 11.

In some embodiments, the number of the partition plates 21 is at least 2, and the temperature compensation unit 12 is clamped between the adjacent partition plates 21. Referring to FIG. 3, the partition plate 21 includes a first partition plate 31 and a second partition plate 32 adjacent to each other, and the temperature compensation unit 12 is clamped between the first partition plate 31 and the second partition plate 32.

Figure 4:
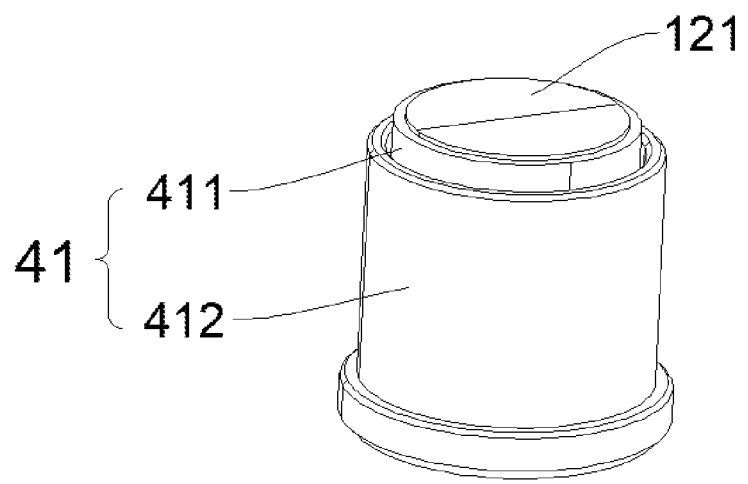
FIG. 4 is a structural diagram of a temperature compensation unit according to an embodiment of the disclosure.
Figure 5:
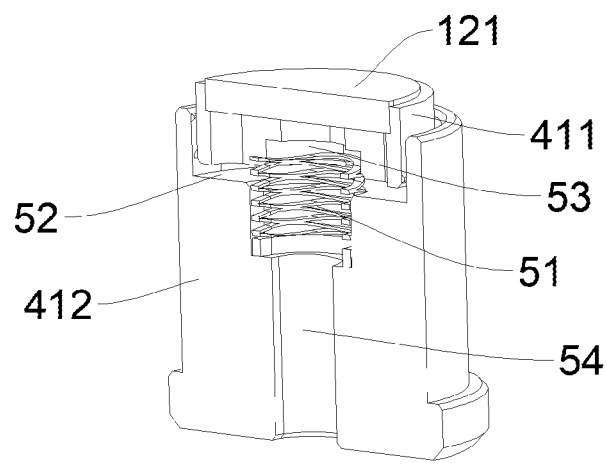
FIG. 5 is a structural diagram of an interior of the temperature compensation unit shown in FIG. 4.

FIG. 4 is a structural diagram of a temperature compensation unit according to an embodiment of the disclosure. FIG. 5 is a structural diagram of an interior of the temperature compensation unit shown in FIG. 4.

In some embodiments, referring to FIG. 3 to FIG. 5, the temperature compensation unit 12 further includes a supporting part 41 arranged at the bottom of the auxiliary temperature adjustment part 121, and an elastic part 51 arranged in the supporting part 41. The supporting part 41 is arranged at the partition plate 21, and the elastic part 51, under the action of the supporting part 41, applies a force to the auxiliary temperature adjustment part 121 in a direction towards the corresponding temperature control compensation area (not shown in the figure) to adjust the distance between the top end of the auxiliary temperature control portion 121 and the corresponding temperature control compensation area (not shown in the figure).

In some embodiments, the elastic part 51, under the action of the supporting part 41, applies a force to the auxiliary temperature adjustment part 121 in a direction towards the corresponding temperature control compensation area (not shown in the figure), to allow the top end of the auxiliary temperature adjustment part 121 to be attached to the corresponding temperature control compensation area (not shown in the figure).

In some embodiments, referring to FIG. 4 and FIG. 5, the supporting part 41 includes an inner supporting part 411 supporting the auxiliary temperature adjustment part 121 and an outer supporting part 412 surrounding the inner supporting part 411, and a spacing exists between outer side walls of the inner supporting part 411 and of the outer supporting part 412.

In some embodiments, referring to FIG. 3 and FIG. 5, one end of the elastic part 51 is arranged in the outer supporting part 412, and the other end thereof is in contact with a bottom of the inner supporting part 411.

In some embodiments, one end of the elastic part 51 is fixed in the outer supporting part, and the other end thereof is connected with the bottom of the inner supporting part 411. The elastic part 51 is in a compressed working state, so as to apply a force to the auxiliary temperature adjustment part 121 in a direction towards the corresponding temperature control compensation area (not shown in the figure), to allow the top end of the auxiliary temperature adjustment part 121 to be attached to the corresponding temperature control compensation area (not shown in the figure).

In some embodiments, referring to FIG. 5, a top of the outer supporting part 412 includes a recessed structure 52, the auxiliary temperature adjustment part 121 is fixedly arranged on a top of the inner supporting part 411, and at least a part of the inner supporting part 411 is accommodated in the recessed structure 52, and the recessed structure 52 defines the movement range of the inner supporting part 411 in a radial direction, so that the auxiliary temperature adjustment part 121 can effectively act on the corresponding temperature control compensation area (not shown in the figure).

In some embodiments, referring to FIG. 3 and FIG. 5, the inner supporting part 411 is internally provided with a first lead hole 53 to allow a lead to pass therethrough, and the outer supporting part 412 is internally provided with a second lead hole 54 to allow a lead to pass therethrough. The first lead hole 53 communicates with the second lead hole 54, the elastic part 51 is of a hollow structure, and two ends of the elastic part 51 communicate with the first lead hole 53 and the second lead hole 54, so that the communication lead (not shown in the figure) provided at the compensation control part 13 can be electrically connected with the auxiliary temperature adjustment part 121 via the second lead hole 54, the elastic part 51 and the first lead hole 53.

In some specific embodiments, the elastic part 51 is a spring.

Figure 6:
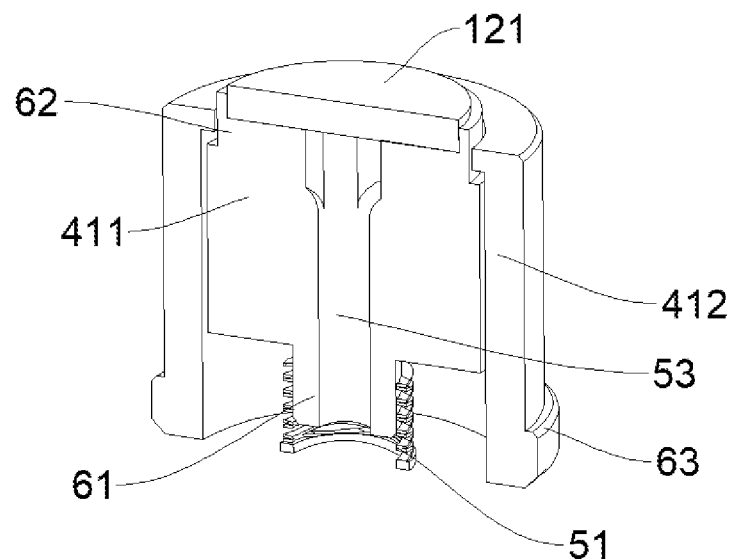
FIG. 6 is a structural diagram of an interior of another temperature compensation unit according to an embodiment of the disclosure.
Figure 7:
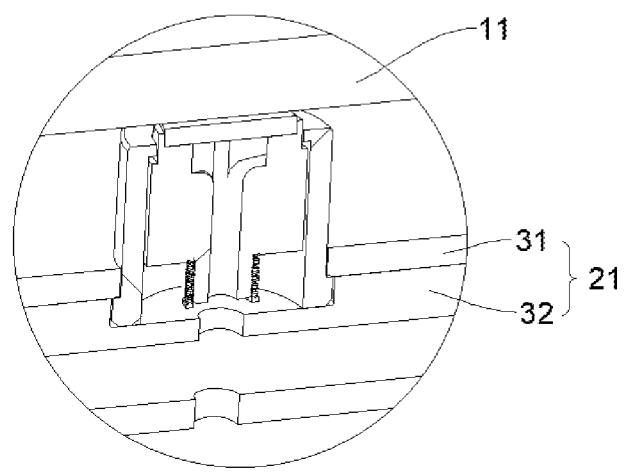
FIG. 7 is a schematic diagram of a working state of the temperature compensation unit shown in FIG. 6 in the heating cavity.

FIG. 6 is a structural diagram of an interior of another temperature compensation unit according to an embodiment of the disclosure; FIG. 7 is a schematic diagram of a working state of the temperature compensation unit shown in FIG. 6 in the heating cavity.

In some embodiments, referring to FIG. 6 and FIG. 7, the elastic part 51 surrounds the bottom of the inner supporting part 411 and is in contact with the partition plate 21. Specifically, the outer supporting part 412 penetrates through a rear bottom of the first partition plate 31 to be in contact with the second partition plate 32, and a bulged structure 63 at the bottom of the outer supporting part 412 is clamped between the first partition plate 31 and the second partition plate 32 to realize detachable and fixed connection of the outer supporting part 412 to the partition plate 21. A bottom of the elastic part 51 is in contact with a top of the second partition plate 32.

In some embodiments, referring to FIG. 6 and FIG. 7, the inner supporting part 411 includes a bottom bulged structure 61, and the elastic part 51 movably surrounds the bottom bulged structure 61. The elastic part 51 is in a compressed working state, so as to apply a force to the auxiliary temperature adjustment part 121 in a direction towards the corresponding temperature control compensation area (not shown in the figure), to allow the top end of the auxiliary temperature adjustment part 121 to be attached to the corresponding temperature control compensation area (not shown in the figure).

In some embodiments, referring to FIG. 6 and FIG. 7, the inner supporting part 411 includes a top bulged structure 62, the top of the outer supporting part 412 surrounds the top bulged structure 62, and the top bulged structure 62 defines the movement range of the outer supporting part 412 in an axial direction.

In some embodiments, referring to FIG. 6 and FIG. 7, a communication lead (not shown in the figure) arranged at the compensation control part 13 can be electrically connected with the auxiliary temperature adjustment part 121 through a first lead hole 53 formed in the inner supporting part 411.

Figure 8:
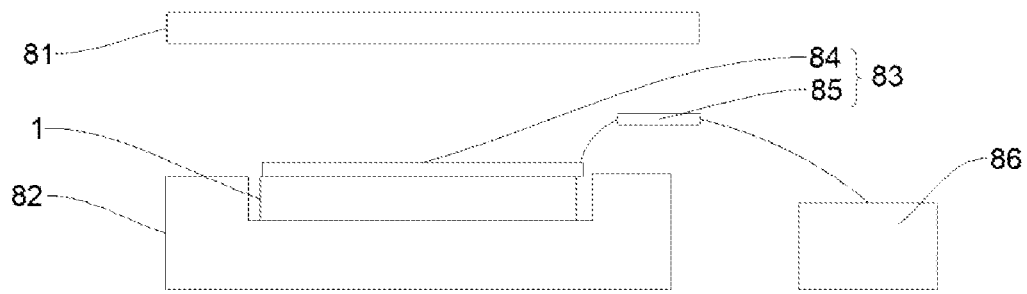
FIG. 8 is a schematic diagram of a working state of a semiconductor device according to an embodiment of the disclosure.

FIG. 8 is a schematic diagram of a working state of a semiconductor device according to an embodiment of the disclosure.

Referring to FIG. 1 and FIG. 8, the semiconductor device shown in FIG. 8 includes the semiconductor substrate heating device 1 shown in FIG. 1 and a temperature calibration part 83. An outer side wall 15 and a sealing plate 14 shown in FIG. 1 are constituent components of an accommodating cavity 82 shown in FIG. 8, and the accommodating cavity 82 and a cover body 81 form the heating cavity.

Referring to FIG. 1 and FIG. 8, the temperature calibration part 83 is in contact with the top surface of the heating plate 11 to acquire and feed back temperature calibration information, and the main control part 86 is arranged outside the heating cavity (not shown in the figure), and is in communication connection with at least one of the compensation control part 13 and the temperature calibration part 84.

In some specific embodiments, the temperature calibration part 83 includes a temperature measurement wafer 84 and a temperature sensing feedback device 85 which are in communication connection. The temperature measurement wafer 84 is in communication connection with the main control part 86 through the temperature sensing feedback device 85.

The temperature control method of the semiconductor device according to the embodiment of the disclosure includes: driving, by the compensation control part 13, at least one temperature compensation unit 12 to perform temperature compensation adjustment on the heating plate 11.

In some embodiments, the step of driving, by the compensation control part 13, at least one temperature compensation unit 12 to perform temperature compensation adjustment on the heating plate 11 includes: controlling the compensation control part 13 by the main control part 86, so as to drive the at least one temperature compensation unit 12 to perform temperature compensation adjustment on the heating plate 11.

In some embodiments, before the step of controlling the compensation control part 13 by the main control part 86 is performed, the temperature measurement wafer 84 is placed on the top surface of the heating plate 11, and various temperature control areas of the heating plate 11 are controlled to heat up by the main control part 86, so that the temperature of the temperature measurement wafer 84 reaches a target temperature.

Specifically, in the heating process of the heating plate 11, the temperature sensing feedback device 85 feeds back temperature values of various temperature measurement sampling points of the temperature measurement wafer 84 to the main control part 86, and the main control part 86 compares an average temperature calculated according to the received temperature values of the temperature measurement sampling points with the target temperature to determine whether the temperature measurement wafer reaches the target temperature.

In the prior art, the temperature uniformity of the heating plate 11 is usually adjusted by controlling the heating plate 11 by zones. For example, the heating plate 11 is divided into seven zones, thirteen zones and fifteen zones. Considering the layout requirements of functional devices and the limitation of wiring installation, the zones of the heating plate 11 cannot be infinite, and each zone includes several temperature measurement sampling points on the temperature measurement wafer 84. For example, when the temperature measurement wafer 84 shows that the temperature uniformity of a certain zone, such as the first zone, does not meet the process requirements and heating-up adjustment is needed, the main control part 86 will control the first zone to heat up. However, this adjustment will bring the following problems: an average temperature of some of the several temperature measurement sampling points included in the first zone will be lower than the target temperature, but temperatures of some of these temperature measurement sampling points will be higher than the target temperature, and the temperature differences between these temperatures and the target temperature are likely to be different from each other. The temperature differences between the temperatures of even the various temperature control areas with the temperatures lower than the target temperature and the target temperature are likely to be different from each other.

It can be seen that the temperature adjustment on a single zone can easily cause the problem of uneven temperatures in the whole range of the heating plate 11 again.

In addition, the above-mentioned zone control mode makes each zone need independent temperature control, which significantly increases the cost of the temperature control part, and the smaller the zones are divided, the higher the cost is.

In a technical solution of an embodiment of the disclosure, after the temperature of the temperature measurement wafer 84 reaches the target temperature, temperature information of various temperature measurement areas of the temperature measurement wafer 84 is acquired by the temperature sensing feedback device 85, and several temperature control compensation areas that perform temperature compensation adjustment at the bottom surface of the heating plate 11 are judged according to the temperature information. Then, the compensation control part 13 is controlled to drive the corresponding temperature compensation unit 12 to heat or cool, so as to achieve the purpose of temperature compensation adjustment.

While the embodiments of the invention have been described in detail, it will be apparent to those skilled in the art that various modifications and changes can be made to the embodiments. However, it is to be understood that such modifications and variations are within the scope and spirit of the invention as described in the appended claims. Furthermore, the invention described herein is susceptible to other embodiments and may be embodied or carried out in various ways.

The invention claimed is:
1. A semiconductor substrate heating device, comprising:
a heating cavity;
a main heating part comprising a heating plate arranged in the heating cavity, wherein a bottom surface of the heating plate comprises at least one temperature control compensation area;
a compensation control part arranged in the heating cavity, wherein a top surface of the compensation control part is adjacent to the bottom surface of the heating plate;
at least one temperature compensation unit arranged between the heating plate and the compensation control part and being in communication connection with the compensation control part;
wherein, the temperature compensation unit and the temperature control compensation area are arranged in a correspondence manner, so as to perform temperature compensation adjustment on the temperature control compensation area under the control of the compensation control part;
wherein the temperature compensation unit comprises an auxiliary temperature adjustment part in communication connection with the compensation control part, and a distance between a top end of the auxiliary temperature adjustment part and the corresponding temperature control compensation area is greater than or equal to 0;
the semiconductor substrate heating device further comprising partition plates arranged between the main heating part and the compensation control part, and the temperature compensation unit is arranged at the partition plates; and
wherein the number of the partition plates is at least 2, and the temperature compensation unit is clamped between the adjacent partition plates.

2. The semiconductor substrate heating device of claim 1, wherein the auxiliary temperature adjustment part comprises a heat conducting element or a refrigerating element.

3. The semiconductor substrate heating device of claim 1, wherein constituent materials of the partition plates comprise a heat insulation material.

4. The semiconductor substrate heating device of claim 1, wherein the temperature compensation unit further comprises a supporting part arranged at a bottom of the auxiliary temperature adjustment part and an elastic part arranged in the supporting part, the supporting part is arranged at the partition plate, and the elastic part, under the action of the supporting part, applies a force to the auxiliary temperature adjustment part in a direction toward the corresponding temperature control compensation area to adjust the top end of the auxiliary temperature adjustment part and the corresponding temperature control compensation area.

5. The semiconductor substrate heating device of claim 4, wherein the supporting part comprises an inner supporting part supporting the auxiliary temperature adjustment part and an outer supporting part surrounding the inner supporting part, and a spacing exists between outer side walls of the inner supporting part and of the outer supporting part.

6. The semiconductor substrate heating device of claim 5, wherein one end of the elastic part is arranged in the outer supporting part, and the other end thereof is in contact with a bottom of the inner supporting part.

7. The semiconductor substrate heating device of claim 5, wherein the elastic part surrounds the bottom of the inner supporting part and is in contact with the partition plate.

8. The semiconductor substrate heating device of claim 5, wherein the inner supporting part is internally provided with a lead hole to allow a lead to pass therethrough.

9. The semiconductor substrate heating device of claim 5, wherein the outer supporting part is internally provided with a lead hole to allow a lead to pass therethrough.

10. The semiconductor substrate heating device of claim 1, wherein the main heating part further comprises a main control part for temperature control, and the compensation control part is in communication connection with the main control part so as to perform the temperature compensation adjustment under the control of the main control part.

11. The semiconductor substrate heating device of claim 1, wherein a top surface of the heating plate comprises a substrate contact area, the bottom surface of the heating plate comprises a bottom surface control area corresponding to the substrate contact area, and the temperature control compensation area is any area within the bottom surface control area.

12. A semiconductor device, comprising the semiconductor substrate heating device of claim 1.

13. The semiconductor device of claim 12, further comprising a temperature calibration part, wherein the main heating part further comprises a main control part, the temperature calibration part is in contact with a heating surface of the heating plate in the semiconductor substrate heating device to acquire and feed back temperature calibration information, and the main control part is arranged outside the heating cavity and is in communication connection with at least one of the compensation control part and the temperature calibration part.

14. A temperature control method of the semiconductor device of claim 12, comprising the following steps:
- S0: providing the semiconductor device, wherein the semiconductor device includes a heating cavity, a main heating part, a compensation control part and at least one temperature compensation unit;
- S1, driving, by the compensation control part, the at least one temperature compensation unit to perform temperature compensation adjustment on the bottom surface of the heating plate of the main heating part.

\* \* \* \* \*